United States Patent
Andreev et al.

(10) Patent No.: US 6,886,088 B2
(45) Date of Patent: Apr. 26, 2005

(54) MEMORY THAT ALLOWS SIMULTANEOUS READ REQUESTS

(75) Inventors: Egor A. Andreev, San Jose, CA (US); Anatoli A. Bolotov, Cupertino, CA (US); Ranko Scepanovic, San Jose, CA (US); Alexander E. Andreev, San Jose, CA (US)

(73) Assignee: LSI Logic Corporation, Milpitas, CA (US)

(*) Notice: Subject to any disclaimer, the term of this patent is extended or adjusted under 35 U.S.C. 154(b) by 322 days.

(21) Appl. No.: 10/308,334

(22) Filed: Dec. 3, 2002

(65) Prior Publication Data

US 2004/0107308 A1 Jun. 3, 2004

(51) Int. Cl.7 .................................. G06F 13/00
(52) U.S. Cl. ................ 711/168; 711/5; 711/104; 711/173; 711/220
(58) Field of Search .................. 711/5, 104, 168, 711/173, 220

(56) References Cited

U.S. PATENT DOCUMENTS

| | | | |
|---|---|---|---|
| 5,339,427 A | * 8/1994 | Elko et al. | 718/103 |
| 5,781,480 A | 7/1998 | Nogle et al. | 365/189.04 |
| 6,023,720 A | * 2/2000 | Aref et al. | 718/103 |
| 6,212,607 B1 | 4/2001 | Miller et al. | 711/149 |
| 6,233,197 B1 | 5/2001 | Agrawal et al. | 365/230.05 |
| 6,320,811 B1 | 11/2001 | Snyder et al. | 365/230.03 |

OTHER PUBLICATIONS

Ulig, D., On the Synthesis of Self–Correcting Schemes From Functional Elements with a Small Number of Reliable Elements (in Russian).

Proceedings of the Fourth Israel Symposium on Theory of Computing and Systems, Jun. 12, 1996.

* cited by examiner

Primary Examiner—Reba I. Elmore
(74) Attorney, Agent, or Firm—Suiter West PC LLO

(57) ABSTRACT

The present invention is directed to a memory that allows two simultaneous read requests with improved density. In an aspect of the present invention, a memory module includes at least two primary memory sub-modules and an additional memory sub-module including a sum of values located in the at least two primary memory sub-modules at corresponding addresses. The sum of the additional memory module enables at least two simultaneous read requests to be performed.

25 Claims, 3 Drawing Sheets

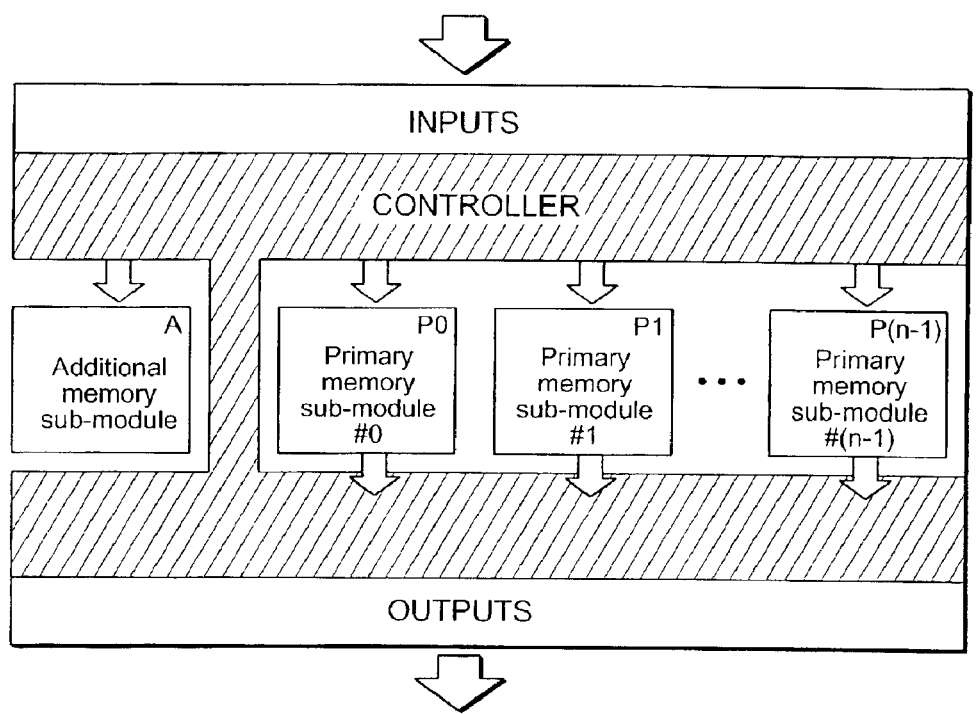
FIG._1

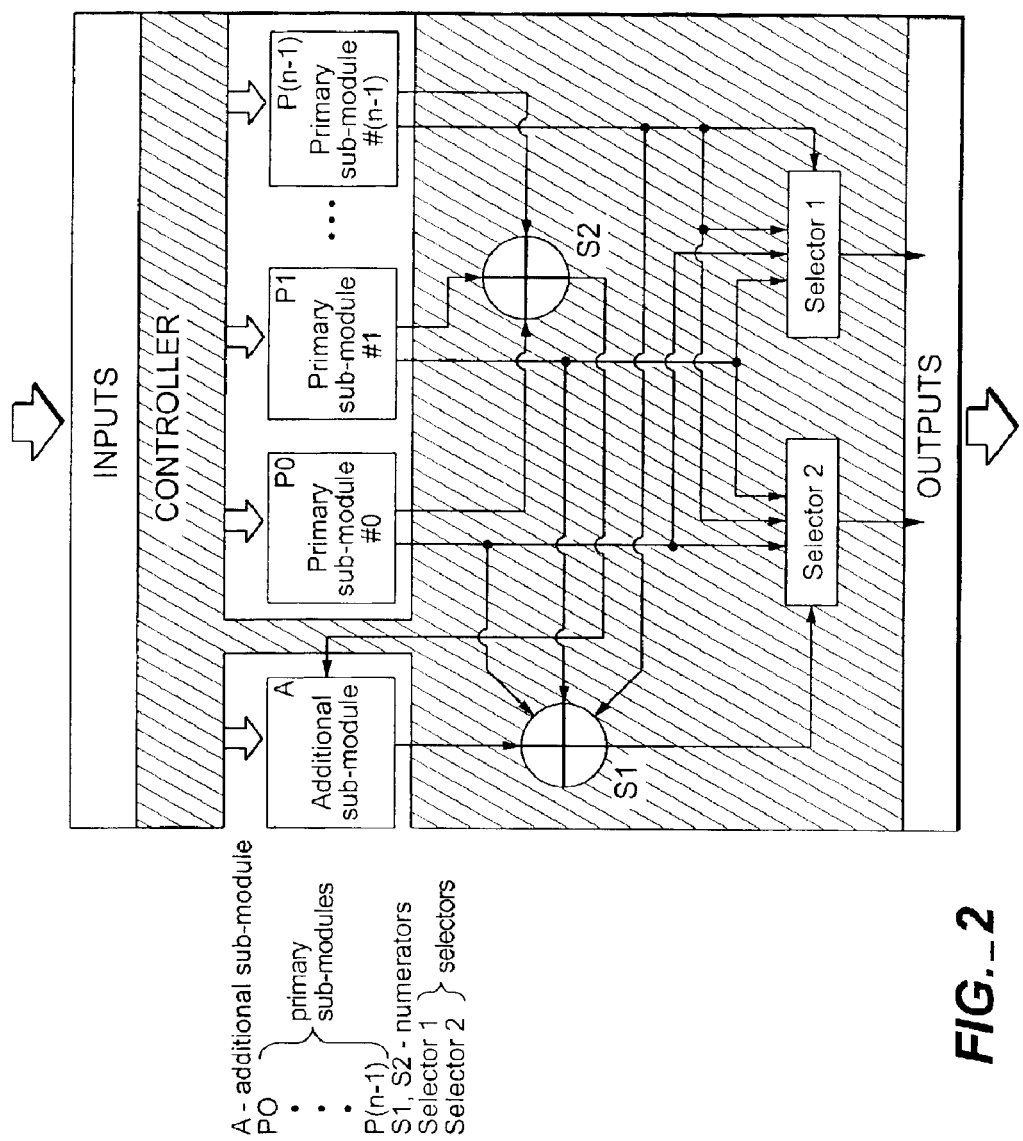
FIG._2

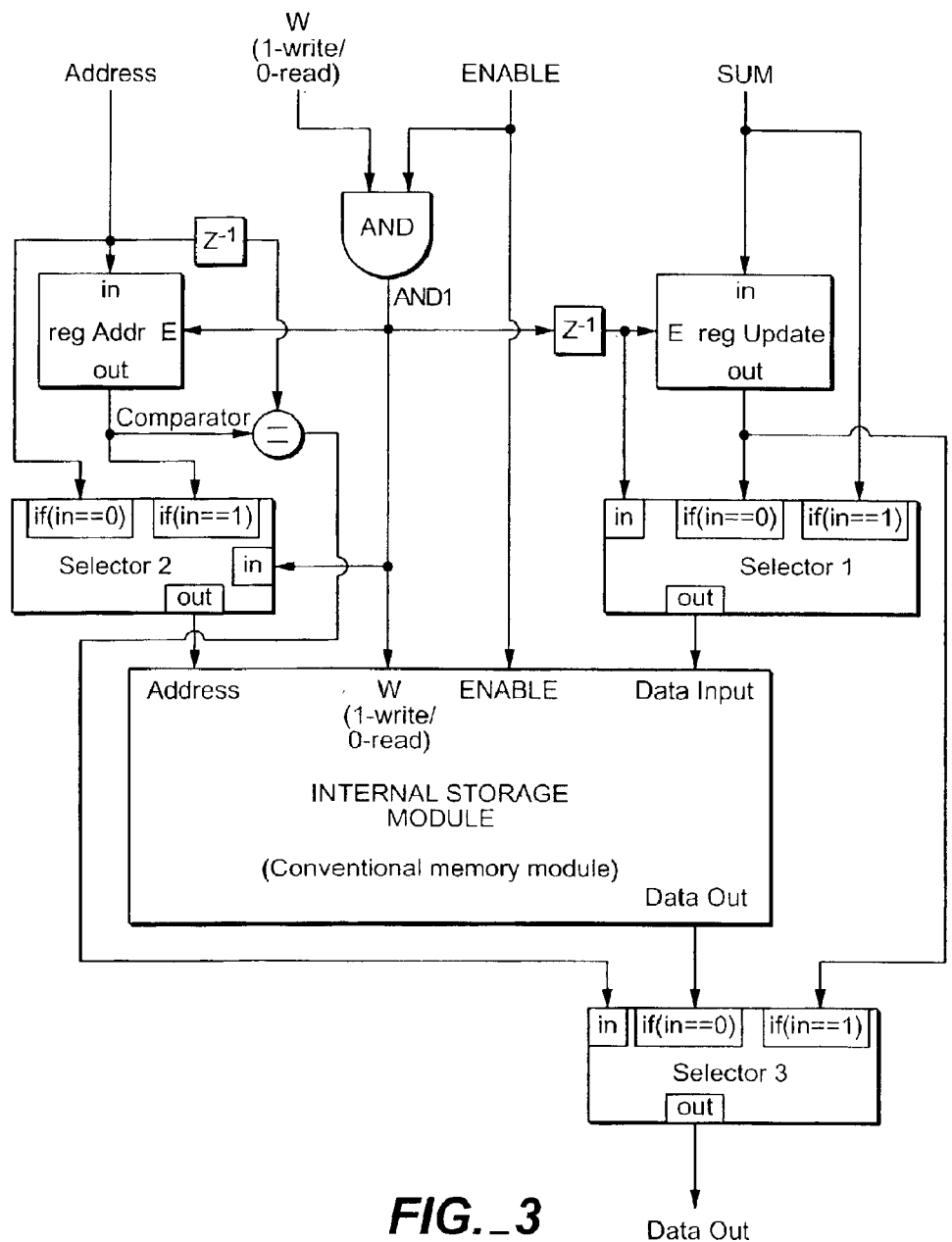
FIG._3

MEMORY THAT ALLOWS SIMULTANEOUS READ REQUESTS

FIELD OF THE INVENTION

The present invention generally relates to the field of memories, and particularly to a memory that allows at least two simultaneous read requests with almost the same density as a one-port memory.

BACKGROUND OF THE INVENTION

Efficiency and performance are the driving forces behind the manufacture, marketing and implementation of electronic devices. Electric devices with an advantage in any one of these areas have a corresponding advantage in the marketplace, as consumers desire ever increasing performance in less expensive devices.

One method that may be utilized to improve the efficiency of an electronic device is through increasing the performance of data storage and access. Because data storage and access is at the heart of electronic devices, performance gains in this area may have a profound effect on an overall device and system. One such method that may be utilized to increase the performance of a memory is to enable simultaneous read requests. Usually, implementations of memory modules that allow simultaneous read requests take no less than twice the space and logic elements required by a conventional module and only function properly in certain predefined conditions. Because of the increased space requirement, the previous inclusion of this functionality was expensive and time consuming, and therefore was not utilized in a wide range of devices. Therefore, consumers were often forced to forgo the increased performance if expense was an issue.

Therefore, it would be desirable to provide a memory that allows at least two simultaneous read requests with almost the same density as a one-port memory.

SUMMARY OF THE INVENTION

Accordingly, the present invention is directed to a memory that allows two simultaneous read requests with improved density. In an aspect of the present invention, a memory module includes at least two primary memory sub-modules and an additional memory sub-module including a sum of values located in the at least two primary memory sub-modules at a corresponding address. The sum of the additional memory module enables at least two simultaneous read requests to be performed.

In an additional aspect of the present invention, a memory module includes at least two-primary memory sub-modules and an additional memory sub-module including a plurality of addresses. At an address x of the plurality of addresses, the additional memory sub-module includes a bitwise XOR sum of values located in the at least two primary memory sub-modules at a corresponding address.

In a further aspect of the present invention, a semiconductor includes a memory module having at least two primary memory sub-modules, the primary memory sub-modules having registers for storing data. An additional memory sub-module including a sum of values located in the at least two primary memory sub-modules at a corresponding address is also included. The sum of the additional memory module enables at least two simultaneous read requests to be performed. The memory module also includes a controller which provides communications within the module, the controller connected to data and address inputs of the primary and additional memory sub-modules.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which:

FIG. 1 is a block diagram of an exemplary embodiment of the present invention wherein a memory module that may perform simultaneous read requests is shown;

FIG. 2 is a detailed block diagram of a memory module of an exemplary embodiment of the present invention that may perform simultaneous read requests; and FIG. 3 is a diagram of an exemplary embodiment of the present invention wherein the architecture of an additional module for a memory module that may perform simultaneous read requests is shown.

DETAILED DESCRIPTION OF THE INVENTION

Reference will now be made in detail to the presently preferred embodiments of the invention, examples of which are illustrated in the accompanying drawings.

Referring generally now to FIGS. 1 through 3, exemplary embodiments of the present invention are shown. The present invention provides a new architecture of memory modules using one-port memories that allows the architecture to process two simultaneous read requests during one clock cycle. A one-port memory module for the sake of the present discussion is a memory that may serve one read or one write request per clock cycle.

One of the features of this invention is that such a memory module requires approximately just $(1+(1/n))$ (where n is the number of internal memory partitions that a user can choose) times more elements that a conventional memory. For example, if ten memory partitions are chosen, then the area of a memory module of the proposed type will be approximately ten percent more than a one-port memory module. Previous approaches to this problem generated solutions of memory modules having an area approximately as twice as large as a one or two-port memory module of a corresponding capacity. Also, a delay of the memory may be significantly less than the delay of a one-port memory block of the same capacity due to the fact that a module of the proposed model makes use of one-port memories of capacity of a fraction $(1/n)$ of the total module's capacity (usually, the smaller a one-port memory block's capacity, the smaller the corresponding delay).

In an embodiment of the present invention, an additional memory module is provided for redundant data in order to serve multiple simultaneous read requests. Each word of the additional memory module located at the address x contains (unless specified otherwise) the (bitwise XOR) sum of all the values located in the primary memory modules at the same local address (i.e. address of a word in the address space of the module it located in).

Although the following discussion describes a module that allows two simultaneous read requests, using this architecture (see FIG. 1) recursively, it is possible to construct a memory module that may serve more than two simultaneous read requests. For instance, through use of the present invention, a person of ordinary skill in the art may build such a module that may serve n simultaneous memory requests, where n=m+a, where m is the maximum number of read requests that may be processed by each of the primary sub-modules simultaneously (i.e. in one clock cycle) and a is the maximum number of read requests that may be processed simultaneously by its additional module, and where a<=m. It should be noted that multiple recursive use of such modules with large values of n used to build memories that allow more simultaneous read requests may be limited because of latency caused by additional circuits that perform control and summations.

In an embodiment of the present invention, the contents of a memory module are evenly distributed between n sub-modules that operate in a similar manner to conventional memory modules. The memory module also has an additional memory bank each word of which contains (unless specified otherwise) sums (bitwise XOR) of all the values located in the other memory banks at the same local address (within a module the word located in) as it is. This allows the proposed type of memory module to read a particular memory location not only directly from which the sub-module is located, but also by reading values at the same (as of the requested value) local address from all the modules except the one from which the requested value is located and by summing the values by using bitwise XOR. In this way, a memory module of the above-described architecture may handle at least two parallel read requests even when both of the read requests refer to memory locations that are located in the same sub-module.

In practice, such memory modules may be used to speed up tasks that are suitable for being parallelized, such as image and video processing, search engines, microprocessors, and the like.

The problem of creating a memory module using conventional one-port memories that allows to process two simultaneous requests at a time has been identified by the present invention to be related to the mathematical problem of computing a Boolean function for several independent inputs at the same time. See Ulig D., *On the Syntehsis of Self-Correcting Schemes from Functional elements with a Small number of Reliable Elements*, notes Acad. Sci., USSR 15, 558–562 (1974); and Alexander E. Andreev, Andrea E. R. Clementi, Paolo Penna, *On the Parallel Computation of Boolean Functions on Unrelated Inputs*, Proceedings of ISTCS '96 (1996), which are herein incorporated by reference in their entirety. Both of the proposed models are not directly applicable for implementation in hardware, however, the present invention provides such a direct implementation.

An embodiment of the present invention showing a new architecture for memory modules that may serve two parallel read requests in one clock cycle is depicted in FIG. 1. Each of the modules shown in the figure will be described in detail in the following discussion.

For sake of the present example, assume a two port memory module of capacity of N words is desired. Therefore, a module that includes (n+1) memory sub-modules, and each of them has the capacity of at least M (where M>=N/n) words should be constructed. The first n sub-modules are the primary sub-modules, with the remaining sub-module(s) being the additional sub-module. The module also has a controller. Every memory sub-module has its own behavior, but all of the sub-modules use the same word size.

The primary sub-modules are used to store the module's memory contents, and the additional sub-module is used to store additional redundant information.

In the present discussion, the module's address space is referred to as the "global address space." Therefore, all of the module's addresses will be referred to as a global address (or addresses). Additionally, each of the sub-modules have a corresponding address space which will be referred to as local address spaces and the corresponding addresses as local address (or local addresses). All the address spaces may have the form: 0'th word, 1'th word, . . . , ("size of the address space"–1)'th word.

Every local address of a primary sub-module corresponds to an address in the global address space and vice versa. For sake of the present discussion, the primary sub-modules are numbered from 0 to (n–1) (p0–p(n–1) on FIG. 1) and assume that "global address"="sub-module's number"*M+ "local address".

The module may perform as follows: at a time the module may either receive one write request or a pair of read requests. One clock cycle is required to complete any of these tasks. The results appear on the outputs in that clock cycle.

Each memory sub-module contains a module of conventional memory of the sub-module's capacity. Hereinafter, these modules will be referred to as "internal storage modules".

Each word of the additional memory module located at address x contains (unless specified otherwise) the (bitwise XOR) sum of all the values located in the primary memory modules at the same local address. If two simultaneous requests refer to addresses located in two different primary memory sub-modules, then the controller sends read requests to the corresponding sub-modules (and each of the sub-modules completes the corresponding request simultaneously).

If a module is requested to read and output two words located in the same memory sub-module, then, previously, a problem arose because no "conventional" one-port memory module could process two simultaneous read requests. However, the present invention solves this problem by using the (bitwise XOR) sum of all the values located in the rest of the primary sub-modules and the additional value at the same address as the local address of the requested word (within the memory sub-block the word is located) equals the requested word. In other words:

$$\mathrm{mem}(x) = \mathrm{addn}[x(\mathrm{mod}(M))] + \sum_{i=1}^{n} \mathrm{primary}\left[\left\lfloor\frac{x}{m}\right\rfloor\right][x(\mathrm{mod}(M))]$$

where a(mod(b)) denotes a function that returns remainder of division of a by b, and mem(x) denotes the value of the word located at the x'th position, and addn[x] denotes the value of the x'th word in the additional memory sub-module, and primary [x][y] denotes the value of the y'th word of the x'th primary memory sub-module. It should be noted that all the summation operations used in the above equation sum by the bitwise XOR. When the above-described situation occurs, the first request in which simultaneous reads to separate sub-modules is completed as usual. In the second instance, in which a read is requested from the same sub-module, each of the memory sub-modules receives a request.

For example, a module may have two primary sub-modules and an additional sub-module in accordance with the architecture as previously described. Two simultaneous read requests may request the contents of primary[0][y] and of primary[1][z]. In this case, primary[0] (which is p0 on FIG. 1) processes request for primary[0][y] and primary[1] (which is p1 on FIG. 1) processes request for primary[0][z].

If two simultaneous read requests ask for primary[1][y] and primary[1][x], then primary[1] (which is p1 on FIG. 1) has two simultaneous requests that ask for its contents. Previous architectures could handle only one of the requests, and would require that the other request be delayed. Such an instance may be referred to as "memory collision." The present invention solves this problem by assigning primary [1] to process request for primary[1][y] and at the same time by issuing read requests to primary[0] and the additional module for primary[0][x] and addn[x] respectively. At the start of the next clock cycle, the module (more precisely, the corresponding controller) directs the output of primary[1] (which is has to the value of primary[1][y] at the moment) to the module's first read output, and calculates the sum (this operation is performed by the summator S1 (an example of which is shown in FIG. 2) of primary[0][x] and addn[x] (which appears on the outputs of primary[0] and the additional module respectively).

According to the formula as described previously, the sum equals primary[1][x]. The sum is directed to the second read output of the module. As is apparent to a person of ordinary skill in the art, two simultaneous read requests that refer the same sub-block and therefore, generate a memory collision, are processed in one clock cycle through use of the present invention. For instance, the sub-modules may contain the following words at a local address x:

primary[0][x]=0101
primary[1][x]=1100 therefore:
addn[x]=1001.

Then the sum (bitwise XOR) of primary[0][x] and of addn[x] is (0101 XOR 1001)=1100 which equals primary [1][x].

If a write request arrives which refers to primary[1][x], then primary[1] is enabled to perform a write operation to primary[1][x], and primary[0] is enabled to read primary[0] [x]. At the next clock cycle, the new value of primary[1][x] is summed, which may be performed by summator S2 as shown in FIG. 2, with the value read from primary[0], namely primary[0][x], and the sum is stored in the additional module. Behavior of the additional module will be described subsequently.

Primary Sub-Modules

Each of the primary memory sub-modules may contain a circuit that decides whether the current request(s) requires it to be invoked. Preferably, each of the primary memory sub-modules contain a conventional memory module of M (or more) words. The following lists several exemplary situations of the functioning of the memory module.

Write Request

In a write request, the sub-module calculates the local address of the word, passes the address to an internal storage module and enables the address. If a word must be written inside the current sub-module, then the new value of the word is passed with an instruction to perform a write operation to the internal storage module. Otherwise, a read operation is performed.

Read Requests

There are a variety of instances in which two simultaneous read requests are received. For instance, if the current sub-module is referred in the first read request, then the memory module passes the word's local address to an internal storage module along with a command to perform a read operation and enables the command.

If both of the read requests refer to the same sub-module and the module is not referred by them, then the local address is passed from the second request to an internal storage module along with a command to perform a read operation, and enables the command.

If the read requests refer from different sub-modules and the second request refers this sub-module, then the local address from the second request is passed to its internal storage module along with a command to perform a read operation, which is then enabled. Otherwise, the current module does not need to perform an action.

Additional Sub-Module

The "additional" sub-module acts similarly to a conventional memory module. However, the additional sub-module requires that, for a write request, the new value of the specified word, which is referred to as an "update," must arrive to its inputs at the start of the next clock cycle after the one at which the corresponding write request had been received. The reason for this will be described subsequently.

Because the "update" arrives at the inputs of a sub-module of this type in the next clock cycle after the write request itself, the additional sub-module must have an additional circuit in order to adapt to this kind of behavior because typical internal storage module do not support this behavior. For example, a write request may arrive at a first clock cycle, and the "update" arrives at the next clock cycle, a second clock cycle.

However, at the second clock cycle, the module may also receive a read request. An internal storage module configured as a conventional memory module cannot process a read and a write request at the same time. In order to avoid such congestion, the sub-module does not update the internal storage module immediately upon an "update" arrival. Instead, the sub-module saves the value and the address of an "update" in registers inside the sub-module. When the next write request arrives, the sub-module updates the internal storage module by performing the pervious update. If the previous write request was initiated during the previous clock cycle, then the "update" arrives during the current clock cycle and is directed to the inputs of the internal storage module. Otherwise, the outputs of the register that stores the "update" are connected to the inputs instead. The outputs of the register that stores the address of the "update" are directed to the inputs as well. Therefore, in this example, during the second clock cycle, one register contains the "update's" address, the another register is in the process of storing the "update", and the internal memory block is processing the read request that arrived at the start of the clock cycle.

There may be a case when a read request refers to a word that has been updated by the last write request. In this situation, the internal storage module does not reflect the update, yet. In such a case, the outputs of the register (in some cases, the wires of the input of the sub-module thru which "updates" arrive) are connected to the outputs of the sub-module.

Referring now to FIG. 3, an exemplary embodiment of the present invention is shown wherein an additional sub-module architecture is shown.

Additional Sub-Module Interface

If the "ENABLE" input equals 0, the additional sub-module does not perform an operation in the current clock cycle regardless of what arrives to the other inputs. Otherwise, the additional sub-module has the following functionality. If the additional sub-module's one-bit input W equals 0, then the additional sub-module performs a read operation in the current clock cycle. Otherwise, the additional sub-module performs a write operation. A requested operation is performed on the word at the address indicated by the value that arrives at the module's "Address" input (at the same clock cycle). If a write operation has been requested, then the referenced word will be set to the value that arrives to the module's "SUM" input at the next clock cycle. Execution of any operation takes one clock cycle. If a read operation has been requested, then the read operation's result appears on the module's "Data Out" output at the next clock cycle.

Description of Components

The depicted architecture of FIG. 3 has two registers, regAddr and regUpdate. Preferably, the two registers function as follows. Preferably, a register of this type has an internal value to which the register's output (out) is always set. The value may be changed by setting the register's input "E" to 1. If "E" is set to 1, then the register will assume the value supplied to the input (in) starting from the next clock cycle. The register does not perform an action if "E" is set to 0. Also, the architecture has several registers named $Z^1$, which do not have an "E" input as indicated in FIG. 3. Thus, it may be assumed that the "E" inputs are always set to 1, so a $Z^1$ register delays whatever arrives onto its inputs by one clock cycle. In other words, the $Z^1$ register sets its output to whatever was on its input in the previous clock cycle.

A selector module, such as Selector 1, Selector 2 and Selector 3, may work as follows. If the selector module's input "in" equals 0, then the selector module connects the "if(in=0)" input to the output, otherwise the selector module connects the "if(n=1)" input to it. The internal storage module may be configured as a conventional memory module. Preferably, if the internal storage module "ENABLE" input equals 0, then the internal storage module does not perform an operation in the current clock cycle regardless of the other inputs received. Otherwise, the internal storage module has the following functionality. If the internal storage module one-bit input W equals 0, then the internal storage module performs a read operation in the current clock cycle. Otherwise, the internal storage module performs a write operation. A requested operation is performed on the word at the address indicated by the value that arrives at the module's "Address" input (at the same clock cycle). If a write operation has been requested, then the referenced word will be set to the value that arrives to the module's "Data Input" input (at the same clock cycle). Execution of any operation takes one clock cycle. If a read operation has been requested, then the read operation's result appears on the module's "Data Out" output at the next clock cycle. The comparator module compares the inputs and sets the output to 1 if the inputs are equal. Otherwise, comparator sets the output to 0.

How it Works

A memory collision may occur because data to be written in a write command typically arrives in the next clock cycle after the corresponding write request itself arrives. However, a read request may arrive at the same moment, e.g. second clock cycle. Because of this, a module may not be implemented that saves data to its internal storage module when the data arrives on the module's inputs because a memory collision may occur.

To address this possibility, the present invention provides for the ability to save the last written request in a pair of registers, such as registers as regAddr and regUpdate of FIG. 3, which act to store the last write request's address and data respectively. When a read request arrives, the request's address is compared with the saved address of the last write request. If the addresses are equal, the saved value is returned in the next clock cycle from the last write request. Otherwise, the memory storage module is instructed to perform a read operation at the specified address and return the internal storage module's output in the next clock cycle. When a write request arrives, the address and value are stored into the above-mentioned registers and, at the same clock cycle, the internal storage module is instructed to perform the previous write request.

Communication between Sub-Modules

The sub-modules are connected by the module's controller that facilitates all the communications within the module. In particular, the controller's circuit connects the module's data and address inputs to the "additional" and primary sub-modules where necessary. Also, the module's controller contains a circuit that deals with controlling the "additional" sub-module and the module's outputs (it decides what must be directed into the module's outputs). The controller has a summator, which—in the case when two simultaneous read requests from the previous clock cycle refer the same sub-block—sums (bitwise XOR) the outputs of all sub-modules (including the "additional" one) not referred in the read requests (and this sum gets directed by the controller to the module's outputs as a result of the second read request). Another summator is invoked when a write request was received by the module in the previous clock cycle. This summator sums the outputs of all primary sub-modules that were not referred in the write request with the new value of the modified word. The sum gets directed to the inputs of the "additional" sub-module. Thus, the additional module is designed to receive the new value of the word to be modified by a write request in the next clock cycle after the request has been received.

Module Initialization

It is important, to note that at the moment of initialization of such a module, all the values of registers and of contents of internal storage modules may initialize to undefined values. Therefore, an undefined output may be received if a word is read that has not been updated since initialization.

In exemplary embodiments, the methods disclosed may be implemented as sets of instructions or software readable by a device. Further, it is understood that the specific order or hierarchy of steps in the methods disclosed are examples of exemplary approaches. Based upon design preferences, it is understood that the specific order or hierarchy of steps in the method can be rearranged while remaining within the scope of the present invention. The accompanying method claims present elements of the various steps in a sample order, and are not meant to be limited to the specific order or hierarchy presented.

Although the invention has been described with a certain degree of particularity, it should be recognized that elements thereof may be altered by persons skilled in the art without departing from the spirit and scope of the invention. One of the embodiments of the invention can be implemented as sets of instructions resident in the memory of one or more information handling systems, which may include memory for storing a program of instructions and a processor for performing the program of instruction, wherein the program of instructions configures the processor and information handling system. Until required by the information handling system, the set of instructions may be stored in another readable memory device, for example in a hard disk drive or in a removable medium such as an optical disc for utilization in a CD-ROM drive and/or digital video disc (DVD) drive, a compact disc such as a compact disc-rewriteable (CD-RW), compact disc-recordable and erasable; a floppy disk for utilization in a floppy disk drive; a floppy/optical disc for utilization in a floppy/optical drive; a memory card such as a memory stick, personal computer memory card for utilization in a personal computer card slot, and the like. Further, the set of instructions can be stored in the memory of an information handling system and transmitted over a local area network or a wide area network, such as the Internet, when desired by the user.

Additionally, the instructions may be transmitted over a network in the form of an applet that is interpreted or compiled after transmission to the computer system rather than prior to transmission. One skilled in the art would appreciate that the physical storage of the sets of instructions or applets physically changes the medium upon which it is stored electrically, magnetically, chemically, physically, optically or holographically so that the medium carries computer readable information.

It is believed that the system and method of the present invention and many of its attendant advantages will be understood by the forgoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof. It is the intention of the following claims to encompass and include such changes.

What is claimed is:

1. A memory module, comprising:
   at least two primary memory sub-modules; and
   an additional memory sub-module including a plurality of addresses, wherein at an address x of the plurality of addresses, the additional memory sub-module includes a bitwise XOR sum of values located in the at least two primary memory sub-modules at corresponding addresses.

2. The memory module of claim 1, wherein at least two simultaneous read requests are performed.

3. The memory module of claim 2, wherein the memory requires approximately (1+(1/n)) times more elements that a conventional memory would require that does not have simultaneous read capability, wherein n is the number of internal memory partitions.

4. The memory module of claim 2, wherein the at least two simultaneous read requests include at least two parallel read requests which refer to memory locations located in a same primary memory sub-module of the at least two primary memory sub-modules.

5. The memory module of claim 1, wherein the bitwise XOR is utilized as follows, $$\text{mem}(x) = \text{addn}[x(\text{mod}(M))] + \sum_{i=1}^{n} \text{primary}\left[\left\lfloor \frac{x}{m} \right\rfloor\right][x(\text{mod}(M))]$$

wherein a(mod(b)) denotes a function that returns remainder of division of a by b, and mem(x) denotes the value of the word located at the x'th position, and addn[x] denotes the value of the x'th word in the additional memory sub-module, and primary [x][y] denotes the value of the y'th word of the x'th primary memory sub-module.

6. The memory module of claim 1, wherein the additional memory sub-module includes two registers, regAddr and regUpdate, the two registers acting to store a last write request's address and data respectively, so that when a read request is received, the request's address is compared with the saved address of the last write request, if the addresses correspond, the saved value is returned in a next clock cycle from the last write request.

7. The memory module of claim 6, wherein a write request is received, the address and value are stored in the two registers, respectively, and at a same clock cycle, an internal storage module of the additional memory sub-module is instructed to perform the previous write request.

8. The memory module of claim 1, further comprising a controller which provides communications with the module, the controller connected to data and address input of the primary and additional memory sub-modules.

9. The memory module of claim 8, wherein the controller includes a summator, so that when two simultaneous read requests refer to a same sub-block of the primary sub-modules, the summator sums outputs of the sub-modules not referred in the read requests, including the additional memory sub-module.

10. A memory module, comprising:
    at least two primary memory sub-modules; and
    an additional memory sub-module including a sum of values located in the at least two primary memory sub-modules at a corresponding address, wherein the sum of the additional memory module enables at least two simultaneous read requests to be performed.

11. The memory module of claim 10, wherein the sum is bitwise XOR.

12. The memory module of claim 11, wherein the bitwise XOR is utilized as follows, $$\text{mem}(x) = \text{addn}[x(\text{mod}(M))] + \sum_{i=1}^{n} \text{primary}\left[\left\lfloor \frac{x}{m} \right\rfloor\right][x(\text{mod}(M))]$$

wherein a(mod(b)) denotes a function that returns remainder of division of a by b, and mem(x) denotes the value of the word located at the x'th position, and addn[x] denotes the value of the x'th word in the additional memory sub-module, and primary [x][y] denotes the value of the y'th word of the x'th primary memory sub-module.

13. The memory module of claim 10, wherein the memory requires approximately (1+(1/n)) times more elements that a conventional memory would require that does not have simultaneous read capability, wherein n is the number of internal memory partitions.

14. The memory module of claim 10, wherein the at least two simultaneous read requests include at least two parallel read requests which refer to memory locations located in a same primary memory sub-module of the at least two primary memory sub-modules.

15. The memory module of claim 10, wherein the additional memory sub-module includes two registers, regAddr and regUpdate, the two registers acting to store a last write request's address and data respectively, so that when a read request is received, the request's address is compared with the saved address of the last write request, if the addresses correspond, the saved value is returned in a next clock cycle from the last write request.

16. The memory module of claim 15, wherein a write request is received, the address and value are stored in the two registers, respectively, and at a same clock cycle, an internal storage module of the additional memory sub-module is instructed to perform the previous write request.

17. The memory module of claim 10, further comprising a controller which provides communications with the module, the controller connected to data and address input of the primary and additional memory sub-modules.

18. The memory module of claim 17, wherein the controller includes a summator, so that when two simultaneous read requests refer to a same sub-block of the primary sub-modules, the summator sums outputs of the sub-modules not referred in the read requests, including the additional memory sub-module.

19. A semiconductor, comprising:
a memory module having
at least two primary memory sub-modules, the primary memory sub modules having registers for storing data;
an additional memory sub-module including a sum of values located in the at least two primary memory sub-modules at a corresponding address, wherein the sum of the additional memory module enables at least two simultaneous read requests to be performed; and
a controller which provides communications within the module, the controller connected to data and address inputs of the primary and additional memory sub-modules.

20. The semiconductor of claim 19, wherein the sum is bitwise XOR, which is utilized as follows, $$\text{mem}(x) = \text{addn}[x(\text{mod}(M))] + \sum_{i=1}^{n} \text{primary}\left[\left\lfloor\frac{x}{m}\right\rfloor\right][x(\text{mod}(M))]$$

wherein a(mod(b)) denotes a function that returns remainder of division of a by b, and mem(x) denotes the value of the word located at the x'th position, and addn[x] denotes the value of the x'th word in the additional memory sub-module, and primary [x][y] denotes the value of the y'th word of the x'th primary memory sub-module.

21. The semiconductor of claim 19, wherein the memory module requires approximately (1+(1/n)) times more elements that a conventional memory would require that does not have simultaneous read capability, wherein n is the number of internal memory partitions.

22. The semiconductor of claim 19, wherein the at least two simultaneous read requests include at least two parallel read requests which refer to memory locations located in a same primary memory sub-module of the at least two primary memory sub-modules.

23. The semiconductor of claim 19, wherein the additional memory sub-module includes two registers, regAddr and regUpdate, the two registers acting to store a last write request's address and data respectively, so that when a read request is received, the request's address is compared with the saved address of the last write request, if the addresses correspond, the saved value is returned in a next clock cycle from the last write request.

24. The semiconductor of claim 23, wherein a write request is received, the address and value are stored in the two registers, respectively, and at a same clock cycle, an internal storage module of the additional memory sub-module is instructed to perform the previous write request.

25. The semiconductor of claim 19, wherein the controller includes a summator, so that when two simultaneous read requests refer to a same sub-block of the primary sub-modules, the summator sums outputs of the sub-modules not referred in the read requests, including the additional memory sub-module.

* * * * *